(12) United States Patent
Won et al.

(10) Patent No.: US 10,411,074 B2
(45) Date of Patent: Sep. 10, 2019

(54) DISPLAY DEVICE SUBSTRATE, ORGANIC LIGHT-EMITTING DISPLAY DEVICE INCLUDING THE SAME, AND METHOD OF MANUFACTURING THE SAME

(71) Applicant: LG Display Co., Ltd., Seoul (KR)

(72) Inventors: Sang-Hyuk Won, Goyang-si (KR); Min-Joo Kim, Seoul (KR); Tae-Hwan Kim, Goyang-si (KR); Nam-Yong Kim, Incheon (KR); Go-Eun Lim, Mokpo-si (KR); Seok-Woo Son, Jeollanam-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/814,748

(22) Filed: Nov. 16, 2017

(65) Prior Publication Data

US 2018/0151633 A1    May 31, 2018

(30) Foreign Application Priority Data

Nov. 30, 2016  (KR) .......................... 10-2016-0162271

(51) Int. Cl.
*H01L 27/32* (2006.01)
*H01L 51/52* (2006.01)

(52) U.S. Cl.
CPC ...... *H01L 27/3213* (2013.01); *H01L 27/3248* (2013.01); *H01L 27/3262* (2013.01);
(Continued)

(58) Field of Classification Search
CPC ............. H01L 27/3213; H01L 51/5203; H01L 27/3265; H01L 27/3276; H01L 27/3262; H01L 27/3248; G09G 2310/0264
See application file for complete search history.

(56) References Cited

U.S. PATENT DOCUMENTS

| 2004/0017162 A1* | 1/2004 | Sato | .................... H01L 27/3276 315/169.3 |
| 2009/0224233 A1* | 9/2009 | Obata | ..................... H01L 51/52 257/40 |

(Continued)

FOREIGN PATENT DOCUMENTS

KR   10-2012-0063219 A   6/2012

OTHER PUBLICATIONS

Office Action dated Jun. 15, 2018, from the Korean Patent Office in counterpart Korean application No. 10-2016-0162271.

*Primary Examiner* — Charles V Hicks (74) *Attorney, Agent, or Firm* — Morgan, Lewis & Bockius LLP (57) ABSTRACT

An organic light-emitting display device includes a substrate; a switching thin-film transistor on the substrate; a driving thin-film transistor connected to the switching thin-film transistor; and a light-emitting element connected to the driving thin-film transistor, wherein the switching thin-film transistor and the driving thin-film transistor together include: a lower conductive layer on the substrate; an insulation layer having therein a contact hole configured to expose the lower conductive layer; an upper conductive layer connected to the lower conductive layer through the contact hole; and a mask conductive layer between an upper surface of the insulation layer and the upper conductive layer to overlap the upper conductive layer.

12 Claims, 11 Drawing Sheets

(52) U.S. Cl.
CPC ...... *H01L 27/3265* (2013.01); *H01L 27/3276* (2013.01); *H01L 51/5203* (2013.01); *G09G 2310/0264* (2013.01)

(56) References Cited

U.S. PATENT DOCUMENTS

2016/0079335 A1* 3/2016 Sato ..................... G09G 3/3233
  257/40
2016/0300954 A1* 10/2016 Sasaki ............... H01L 21/32105

* cited by examiner

DISPLAY DEVICE SUBSTRATE, ORGANIC LIGHT-EMITTING DISPLAY DEVICE INCLUDING THE SAME, AND METHOD OF MANUFACTURING THE SAME

This application claims the benefit of Korean Patent Application No. 10-2016-0162271, filed on Nov. 30, 2016, which is hereby incorporated by reference as if fully set forth herein.

BACKGROUND

Technical Field

The present disclosure relates to a display device substrate, an organic light-emitting display device including the same, and a method of manufacturing the same, and more particularly, to a display device substrate that realizes high resolution, an organic light-emitting display device including the same, and a method of manufacturing the same.

Discussion of the Related Art

An image display device, which realizes various pieces of information on a screen, is a core technology of the information and communication age, and is being developed in the direction of becoming thinner, lighter, more portable, and having higher performance. Representative display devices include, for example, a liquid crystal display (LCD) device and an organic light-emitting diode (OLED) display device.

As the resolution of a display device increases, the number of thin layers that are vertically stacked one above another increases due to the reduced design margin resulting from the reduced area of each sub-pixel. In this case, in order to interconnect an upper conductive layer and a lower conductive layer, which are vertically stacked one above another, a narrow contact hole may be required to penetrate a thick insulation layer disposed between the upper conductive layer and the lower conductive layer. Because the loss of a photoresist pattern occurs when such a narrow contact hole is formed by etching the thick insulation layer, the thickness of the photoresist pattern may need to be increased in proportion to the thickness of the insulation layer. However, the greater the thickness of the photoresist pattern, the lower the resolution of an exposure process. Therefore, because a contact hole larger than a contact hole size that is designed for an exposure mask is formed in a substrate, formation of a narrow contact hole may be difficult, and thus the realization of high resolution may be difficult.

SUMMARY

Accordingly, the present disclosure is directed to a display device substrate, an organic light-emitting display device including the same, and a method of manufacturing the same that substantially obviate one or more problems due to limitations and disadvantages of the related art.

An object of the present disclosure is to provide a display device substrate, which may enable the realization of high resolution, an organic light-emitting display device including the same, and a method of manufacturing the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device substrate, an organic light-emitting display device including the same, and a method of manufacturing the same according to the present disclosure include: a substrate; a switching thin-film transistor on the substrate; a driving thin-film transistor connected to the switching thin-film transistor; and a light-emitting element connected to the driving thin-film transistor, wherein the switching thin-film transistor and the driving thin-film transistor together include: a lower conductive layer on the substrate; an insulation layer having therein a contact hole configured to expose the lower conductive layer; an upper conductive layer connected to the lower conductive layer through the contact hole; and a mask conductive layer between an upper surface of the insulation layer and the upper conductive layer to overlap the upper conductive layer.

In another aspect, the display device substrate includes a base substrate; a lower conductive layer on the base substrate; an insulation layer having therein a contact hole configured to expose the lower conductive layer; an upper conductive layer connected to the lower conductive layer through the contact hole; and a mask conductive layer between an upper surface of the insulation layer and the upper conductive layer to overlap the upper conductive layer.

In another aspect, a method of manufacturing a display device substrate includes forming a lower conductive layer on a base substrate; forming an insulation layer, having therein a contact hole configured to expose the lower conductive layer, and a mask conductive layer; and forming an upper conductive layer connected to the lower conductive layer through the contact hole, wherein the mask conductive layer is disposed between an upper surface of the insulation layer and the upper conductive layer to overlap the upper conductive layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principles of the disclosure. In the drawings.

DETAILED DESCRIPTION

Hereinafter, example embodiments of the present disclosure will be described with reference to the accompanying drawings.

Figure 1:
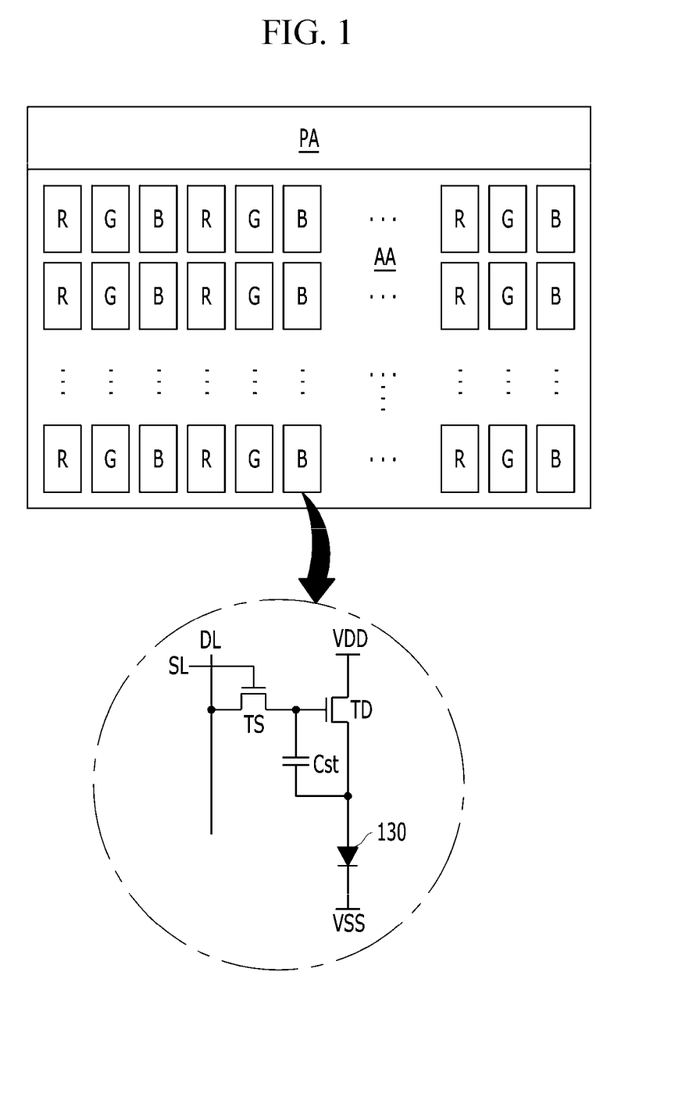
FIG. 1 is a plan view illustrating an organic light-emitting display device according to an example embodiment of the present disclosure.
Figure 2:
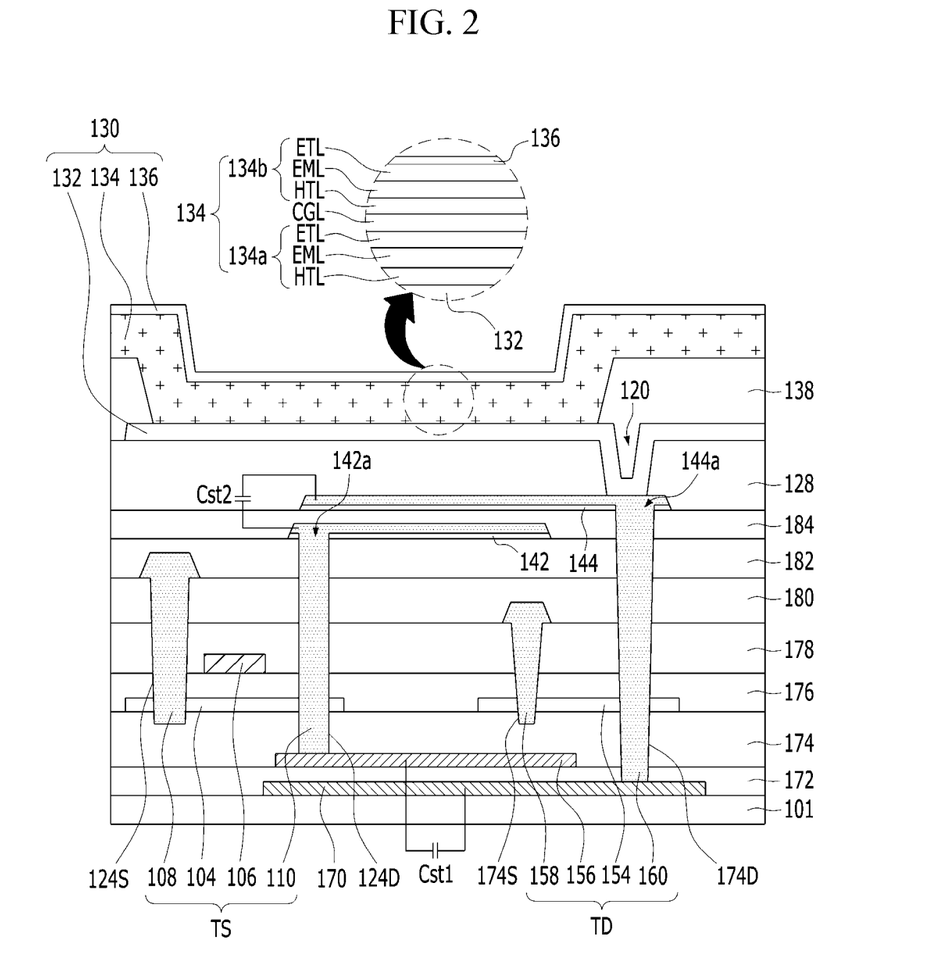
FIG. 2 is a cross-sectional view illustrating an example embodiment of the organic light-emitting display device illustrated in FIG. 1.

FIG. 1 is a plan view illustrating an example embodiment of the organic light-emitting display device according to the present disclosure, and FIG. 2 is a cross-sectional view illustrating an example embodiment of the organic light-emitting display device illustrated in FIG. 1.

The organic light-emitting display device illustrated in FIGS. 1 and 2 includes an active area AA and a pad area PA.

In the pad area PA, a plurality of pads is formed to supply driving signals to each of a scan line SL, a data line DL, a high-voltage VDD supply line, and a low-voltage VSS supply line 160, which are arranged in the active area AA.

The active area AA displays an image via a unit pixel. The unit pixel includes red, green and blue sub-pixels R, G and B, or includes red, green, blue and white sub-pixels R, G, B and W. Each sub-pixel includes the light-emitting element 130 (e.g., an organic light-emitting diode) and a pixel drive circuit that independently drives the light-emitting element 130.

The pixel drive circuit includes a switching thin-film transistor TS, a driving thin-film transistor TD, and a storage capacitor Cst.

The switching thin-film transistor TS is turned on when a scan pulse signal is supplied to the scan line SL, thereby supplying a data signal supplied to the data line DL to the storage capacitor Cst and a second gate electrode 156 of the driving thin-film transistor TD.

To this end, the switching thin-film transistor TS, as illustrated in FIG. 2, includes a first gate electrode 106, a first source electrode 108, a first drain electrode 110, and a first active layer 104.

The first gate electrode 106 is formed on a gate insulation pattern 176 and is connected to the scan line SL. The first gate electrode 106 overlaps the first active layer 104 with the gate insulation pattern 176 interposed therebetween. Because the first gate electrode 106 is disposed above the first active layer 104, the switching thin-film transistor TS has a top-gate structure.

The first source electrode 108 is disposed on a second interlayer insulation layer 180 and is connected to the data line DL. The first source electrode 108 is connected to the first active layer 104 through a first source contact hole 124S, which penetrates the first active layer 104, the gate insulation layer 176, and first and second interlayer insulation layers 178 and 180. That is, the first source electrode 108 is connected to the side surface of the first active layer 104, which is exposed by the first source contact hole 124S.

The first drain electrode 110 is disposed on a first mask conductive layer 142 to face the first source electrode 108 and is connected to the second gate electrode 156 of the driving thin-film transistor TD. The first drain electrode 110 is connected to the first active layer 104 and the second gate electrode 156 of the driving thin-film transistor TD through a first drain contact hole 124D, which penetrates a second buffer layer 174, the first active layer 104, the gate insulation layer 176, the first and second interlayer insulation layers 178 and 180, and a first protective layer 182. That is, the first drain electrode 110 is connected to the side surface of the first active layer 104, which is exposed through the first drain contact hole 124D, and is connected to the upper surface of the second gate electrode 156, which is exposed through the first drain contact hole 124D.

The first active layer 104 forms a channel portion between the first source electrode 108 and the first drain electrode 110. The first active layer 104 is formed on the second buffer layer 174 to be disposed under the first gate electrode 106. The first active layer 104 is formed of at least one of an amorphous semiconductor material, a polycrystalline semiconductor material, and an oxide semiconductor material.

The driving thin-film transistor TD adjusts the amount of light emitted from the light-emitting element 130 by controlling current I supplied from the high-voltage (VDD) supply line to the light-emitting element 130 in response to a data signal supplied to the second gate electrode 156 of the driving thin-film transistor TD. In addition, using the voltage charged in the storage capacitor Cst, even if the switching thin-film transistor TS is turned off, the driving thin-film transistor TD supplies a constant amount of current I until a data signal of a next frame is supplied, thereby maintaining continuous emission of light from the light-emitting element 130.

To this end, the driving thin-film transistor TD, as illustrated in FIG. 2, includes the second gate electrode 156, a second source electrode 158, a second drain electrode 160, and a second active layer 154.

The second gate electrode 156 is disposed on the first buffer layer 172 and is connected to the first drain electrode 110 of the switching thin-film transistor TS. The second gate electrode 156 overlaps the second active layer 154 with a second buffer layer 174 interposed therebetween. Because the second gate electrode 156 is disposed under the second active layer 154, the driving thin-film transistor TD has a bottom-gate structure.

The second source electrode 158 is disposed on the first interlayer insulation layer 178 and is connected to the high-voltage (VDD) supply line. The second source electrode 158 is connected to the second active layer 154 through a second source contact hole 174S, which penetrates the second active layer 154, the gate insulation layer 176, and the first interlayer insulation layer 178. That is, the second source electrode 158 is connected to the side surface of the second active layer 154, which is exposed through the second source contact hole 154S. Meanwhile, although a structure in which the second source electrode 158, as illustrated in FIG. 2, is disposed on the first interlayer insulation layer 178, unlike the first source electrode 108 by way of example, the second source electrode 158 may be formed on the second interlayer insulation layer 180, in the same manner as the first source electrode 108, using the same material as the first source electrode 108, in order to simplify the process. Alternatively, both the first source electrode 108 and the second source electrode 158 may be formed on the first interlayer insulation layer 178 using the same material.

The second drain electrode 160 is disposed on a second mask conductive layer 144 to face the second source electrode 158 and is connected to an anode electrode 132 of the light-emitting element 130 and a storage electrode 170.

The second drain electrode 160 is connected to the second active layer 154 and the storage electrode 170 through a second drain contact hole 174D, which penetrates the first and second buffer layers 172 and 174, the second active layer 154, the gate insulation layer 176, the first and second interlayer insulation layers 178 and 180, and the first and second protective layers 182 and 184. That is, the second drain electrode 160 is connected to the side surface of the second active layer 154, which is exposed through the second drain contact hole 174D, and is connected to the upper surface of the storage electrode 170, which is exposed through the second drain contact hole 174D.

In addition, the second drain electrode 160 is exposed through a pixel contact hole 120, which penetrates the planarization layer 128, and is connected to the anode electrode 132.

The second active layer 154 forms a channel portion between the second source electrode 158 and the second drain electrode 160. The second active layer 154 is formed on the second buffer layer 174 to be disposed above the second gate electrode 156. The second active layer 154 is formed of at least one of an amorphous semiconductor material, a polycrystalline semiconductor material, and an oxide semiconductor material, and is formed of a material, which is the same as or different from that of the first active layer 104.

The storage capacitor Cst includes first and second storage capacitors Cst1 and Cst2, which are connected in parallel with each other. The first storage capacitor Cst1 is formed such that the storage electrode 170 and the second gate electrode 156 of the driving thin-film transistor TD overlap each other with the first buffer layer 172 interposed therebetween. The second storage capacitor Cst2 is formed such that the drain electrode 110 of the switching thin-film transistor TS and the second drain electrode 160 of the driving thin-film transistor TD overlap each other with the second protective layer 184 interposed therebetween.

Here, the first buffer layer 172 and the second protective layer 184 are formed of a material having a dielectric constant higher than that of any one of the second buffer layer 174, the gate insulation layer 176, the first and second interlayer insulation layers 178 and 180, and the first protective layer 182. For example, the first buffer layer 172 and the second protective layer 184 are formed of SiNx, and at least one of the second buffer layer 174, the gate insulation layer 176, the first and second interlayer insulation layers 178 and 180, and the first protective layer 182 is formed of SiOx. Thus, the first and second storage capacitors Cst1 and Cst2 increase in capacity in proportion to a dielectric constant thereof.

Using the voltage charged in the first and second storage capacitors Cst1 and Cst2, even if the switching thin-film transistor TS is turned off, the driving thin-film transistor TD supplies a constant amount of current I until a data signal of a next frame is supplied, thereby maintaining continuous emission of light from the light-emitting element 130.

The light-emitting element 130 includes the anode electrode 132 connected to the second drain electrode 160 of the driving transistor TD, at least one light-emitting stack 134 formed on the anode electrode 132, and a cathode electrode 136 formed on the light-emitting stack 134.

The anode electrode 132 is disposed on the planarization layer 128 and is exposed by a bank 138. The anode electrode 132 is electrically connected to the second drain electrode 160 of the driving thin-film transistor TD, which is exposed through the pixel contact hole 120. The anode electrode 132 is formed as a multilayered structure, which includes a transparent conductive layer and an opaque conductive layer having high reflection efficiency, or is formed as a single-layer structure including an opaque conductive layer having high reflection efficiency, when applied to a top-emission-type organic light-emitting display device. The transparent conductive layer is formed of a material having a relatively large work function value, such as indium-tin-oxide (ITO) or indium-zinc-oxide (IZO), and the opaque conductive layer is formed as a single-layer or multi-layered structure including Al, Ag, Cu, Pb, Mo, Ti, or an alloy thereof. For example, the anode electrode 132 is formed such that a transparent conductive layer, an opaque conductive layer, and a transparent conductive layer are sequentially stacked one above another, or is formed such that a transparent conductive layer and an opaque conductive layer are sequentially stacked one above another. Because the anode electrode 132, which includes the opaque conductive layer, overlaps the pixel drive circuit, an area in which the pixel drive circuit is disposed may also be used as a light-emitting area, which may increase an aperture ratio.

The light-emitting stack 134 is formed on the anode electrode 132 by stacking a hole transport layer HTL, an organic light-emitting layer EML, and an electron transport layer ETL in this sequence or in the inverse sequence. In addition, the light-emitting stack 134 may include first and second light-emitting stacks 134a and 134b, which face each other with a charge generation layer CGL interposed therebetween. In this case, the organic light-emitting layer EML of any one of the first and second light-emitting stacks 134a and 134b generates blue light and the organic light-emitting layer EML of the other one of the first and second light-emitting stacks 134a and 134b generates yellow-green light, whereby white light is generated by the first and second light-emitting stacks 134a and 134b. When the white light generated by the light-emitting stack 134 is introduced into a color filter (not illustrated), which is located above the light-emitting stack 134, a color image may be realized. In addition, each light-emitting stack 134 may generate light of a color that corresponds to each sub-pixel to realize a color image without a separate color filter. That is, the light-emitting stack 134 of a red sub-pixel R may generate red light, the light-emitting stack 134 of a green sub-pixel G may generate green light, and the light-emitting stack 134 of a blue sub-pixel B may generate blue light.

The bank 138 is formed to expose the anode electrode 132 to provide a light-emitting area in each sub-pixel. The bank 138 may be formed of an opaque material (e.g., a black material) in order to prevent light interference between neighboring sub-pixels. In this case, the bank 138 includes a light-shielding material formed of at least one of a color pigment and organic carbon black.

The cathode electrode 136 is formed on the upper surface and the side surface of the light-emitting stack 134 and the bank 138 to face the anode electrode 132 with the light-emitting stack 134 interposed therebetween. The cathode electrode 136 is formed of a transparent conductive layer such as indium-tin-oxide (ITO) or indium-zinc-oxide (IZO) when applied to a top-emission-type organic light-emitting display device.

Meanwhile, in an example embodiment the present disclosure, the first mask conductive layer 142 is disposed between the first drain electrode 110 and the first protective layer 182 to overlap the first drain electrode 110, and the second mask conductive layer 144 is disposed between the second drain electrode 160 and the second protective layer 184 to overlap the second drain electrode 160.

The first mask conductive layer 142 has a first mask hole 142a, which overlaps the first drain contact hole 124D. The first mask hole 142a has a width, which is similar to or the same as that of the drain contact hole 124D. Opposite ends of the first mask conductive layer 142 correspond to opposite ends of the first drain electrode 110. That is, opposite ends of the first mask conductive layer 142 and the first drain electrode 110 may coincide with each other, or opposite ends of the first mask conductive layer 142 may be located inside or outside opposite ends of the first drain electrode 110.

The second mask conductive layer 144 has a second mask hole 144a, which overlaps the second drain contact hole 174D. The second mask hole 144a has a width, which is similar to or the same as that of the second drain contact hole 174D. Opposite ends of the second mask conductive layer 144 correspond to opposite ends of the second drain electrode 160. That is, opposite ends of the second mask conductive layer 144 and the second drain electrode 160 may coincide with each other, or opposite ends of the second mask conductive layer 144 may be located inside or outside opposite ends of the second drain electrode 160.

The first and second mask conductive layers 142 and 144 are formed of a material that has resistance to an etching gas that is used to form the first and second drain contact holes 124D and 174D, rather than being etched thereby. For example, the first and second mask conductive layers 142 and 144 are formed as a single-layer structure or a multi-layered structure using any one of ITO, MoTi and Al, which reacts to an etchant for a wet etching process. The first and second mask conductive layers 142 and 144 are formed of the same material or different materials. At least one of the first and second buffer layers 172 and 174, the gate insulation layer 176, the first and second interlayer insulation layers 178 and 180, and the first and second protective layers 182 and 184 are formed of a material that has etching characteristics different from those of the first and second mask conductive layers 142 and 144. That is, at least one of the first and second buffer layers 172 and 174, the gate insulation layer 176, the first and second interlayer insulation layers 178 and 180, and the first and second protective layers 182 and 184 are formed of an Si-based inorganic layer (e.g., SiNx or SiOx) that reacts to an etching gas for a dry etching process.

The first mask conductive layer 142 serves as a mask along with a photoresist pattern when the second buffer layer 174, the gate insulation layer 176, the first and second interlayer insulation layers 178 and 180, and the first protective layer 182 are dry-etched in order to form the first drain contact hole 124D. In addition, the second mask conductive layer 144 serves as a mask along with a photoresist pattern when the first buffer layer 172, the gate insulation layer 176, the first and second interlayer insulation layers 178 and 180, and the first and second protective layers 182 and 184 are dry-etched in order to form the second drain contact hole 174D.

Figure 3:
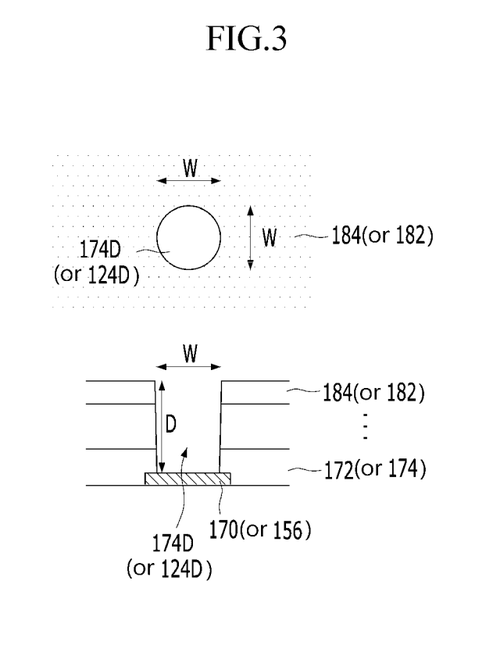
FIG. 3 is a plan view and a cross-sectional view illustrating an example embodiment of first and second drain contact holes illustrated in FIG. 2.

Accordingly, through the provision of the first and second mask conductive layers 142 and 144, which serve as a mask when the first and second drain contact holes 124D and 174D are formed, the thickness of the photoresist pattern may decrease. Because exposure resolution increases as the thickness of the photoresist pattern decreases, the first and second drain contact holes 124D and 174D may be formed to have a narrow line width of 2 µm or less and a depth of 1 µm or more. Specifically, as illustrated in FIG. 3, the inclination angle of the side surface of at least one of the buffer layers, the gate insulation layer, the interlayer insulation layers, and the protective layers, which are exposed through the first and second drain contact holes 124D and 174D, is an acute angle of 80 degrees or more. In this case, each of the first and second drain contact holes 124D and 174D is reduced in line width from the top (e.g., the protective layers 182 and 184) to the bottom (e.g., the buffer layers 172 and 174) thereof, but the difference is slight. Thus, the first and second drain contact holes 124D and 174D, which expose the side surface of the protective layers 182 and 184, have the maximum line width. Here, the maximum line width W of the first and second drain contact holes 124D and 174D is 2 µm or less, for example, 1.5 µm, and the maximum depth D of the first and second drain contact holes 124D and 174D ranges from 1.2 µm to 1.4 µm.

Figure 4:
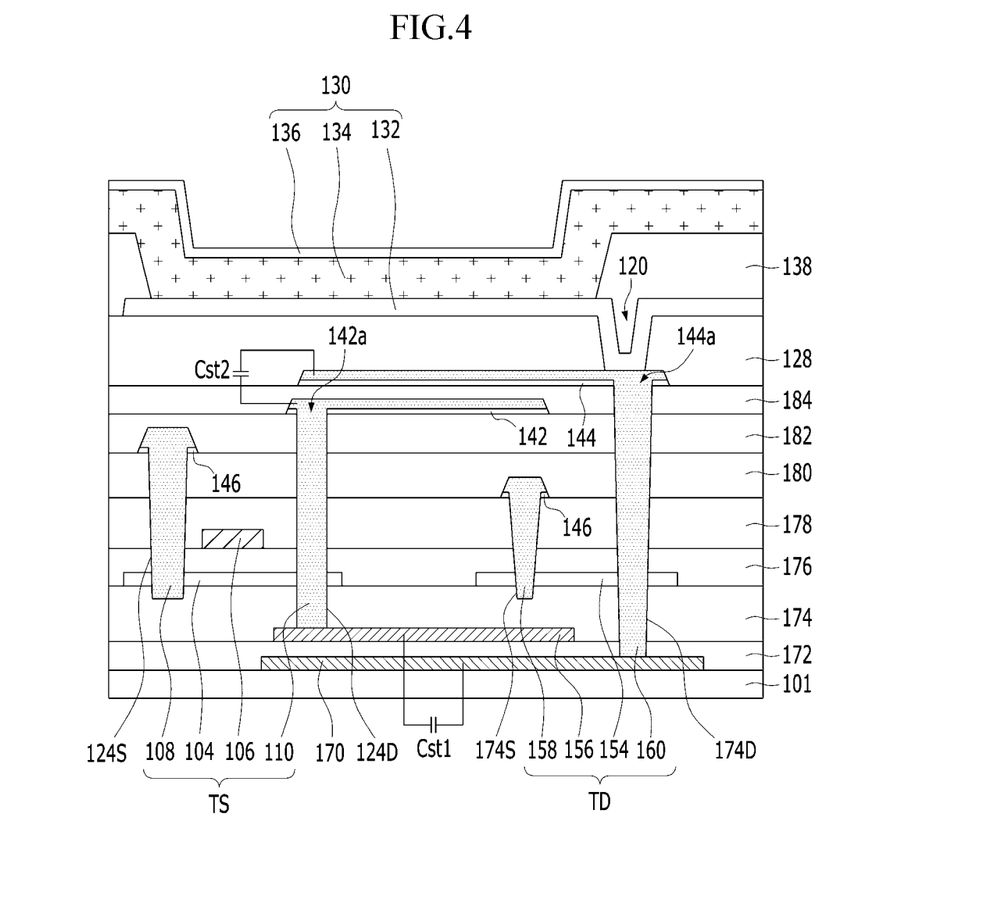
FIG. 4 is a cross-sectional view illustrating another example embodiment of the organic light-emitting display device illustrated in FIG. 1.

Meanwhile, although the first and second drain contact holes 124D and 174D have been described as narrow holes in the present disclosure by way of example, as illustrated in FIG. 4, at least one of the first and second source contact holes 124S and 174S and the pixel contact hole 120 may be formed as a narrow hole. In this case, a third mask conductive layer 146 is disposed between the insulation layer and at least one of the first and second source electrodes 108 and 158 and the anode electrode 132. The third mask conductive layer 146, having the second source contact hole 174S therein, is formed between the first interlayer insulation layer 178 and the second source electrode 158 to overlap the second source electrode 158 and is formed of a material having different characteristics from those of the first interlayer insulation layer 178. In addition, the third mask conductive layer 146 having the first source contact hole 124S therein is formed between the second interlayer insulation layer 180 and the first source electrode 108 to overlap the first source electrode 108 and is formed of a material having different characteristics from those of the second interlayer insulation layer 180. For example, the first and second interlayer insulation layers 178 and 180 are formed of SiNx or SiOx, which reacts to an etching gas for a dry etching process, and the third mask conductive layer 146 is formed as a single-layer structure or a multilayered structure using any one of ITO, MoTi and Al, which reacts to an etchant for a wet etching process.

Figure 5A:
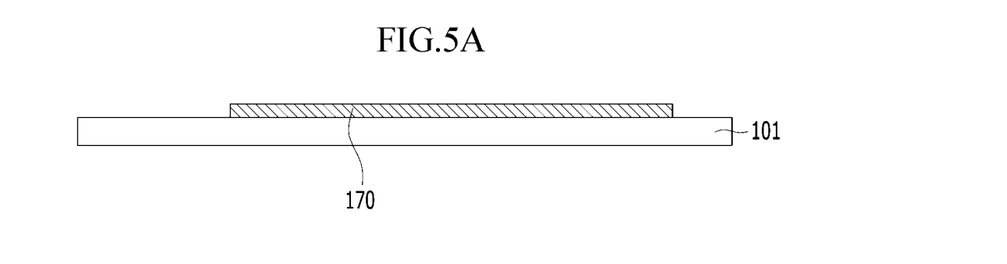
FIGS. 5A to 5N are cross-sectional views for explaining an example method of manufacturing the organic light-emitting display device illustrated in FIG. 2.
Figure 5B:
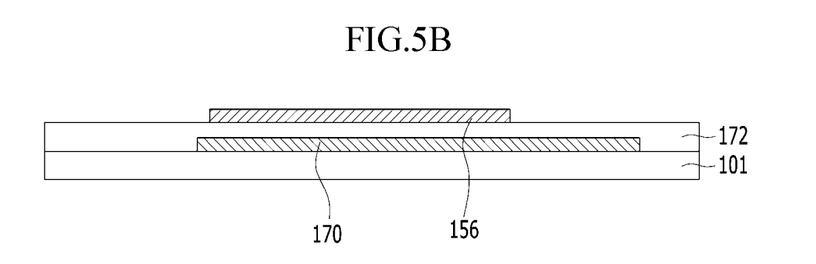
Figure 5C:
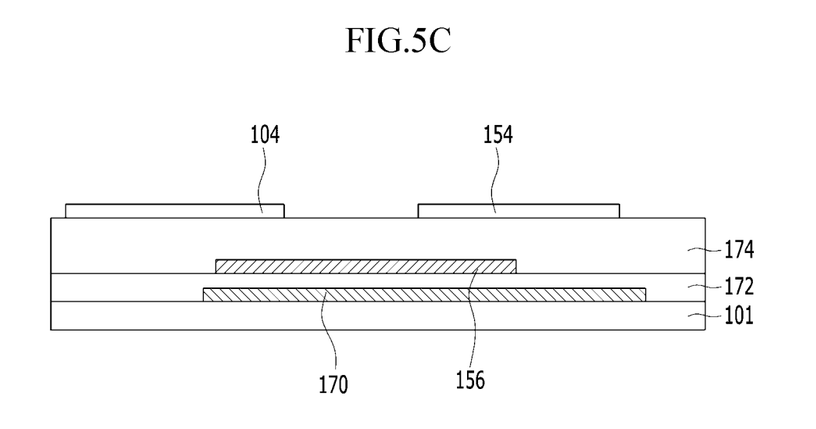
Figure 5D:
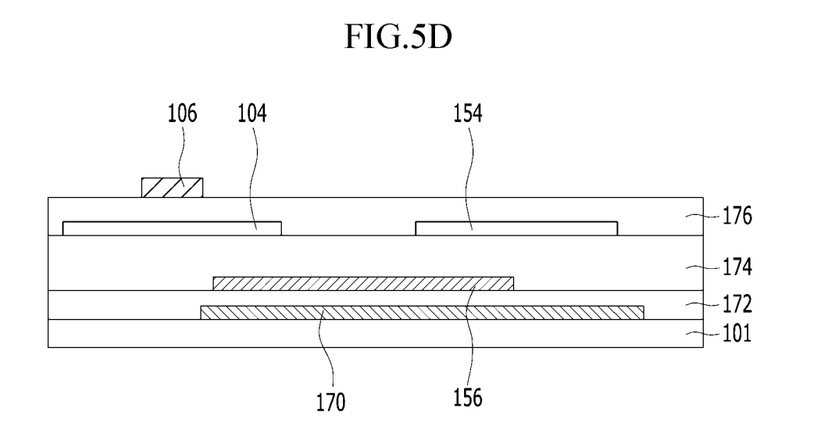
Figure 5E:
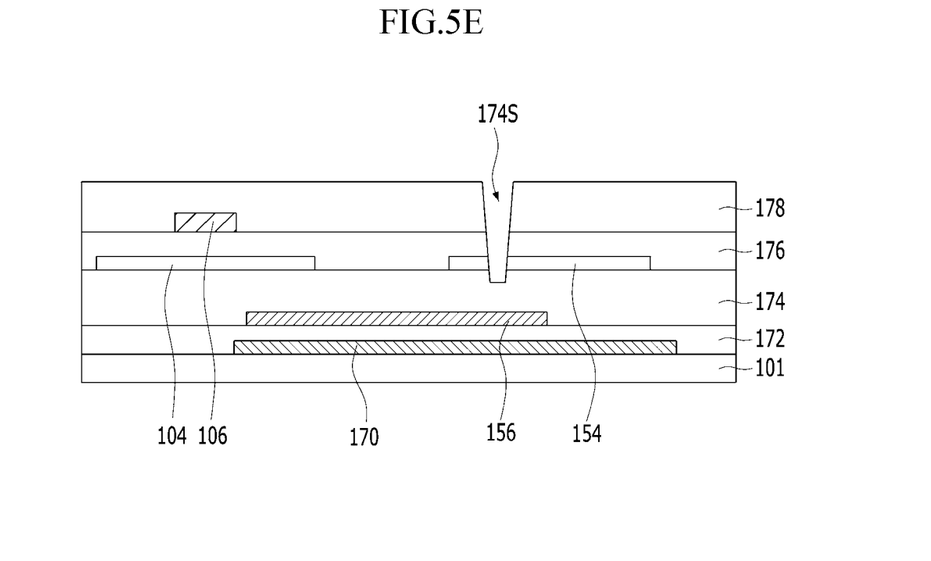
Figure 5F:
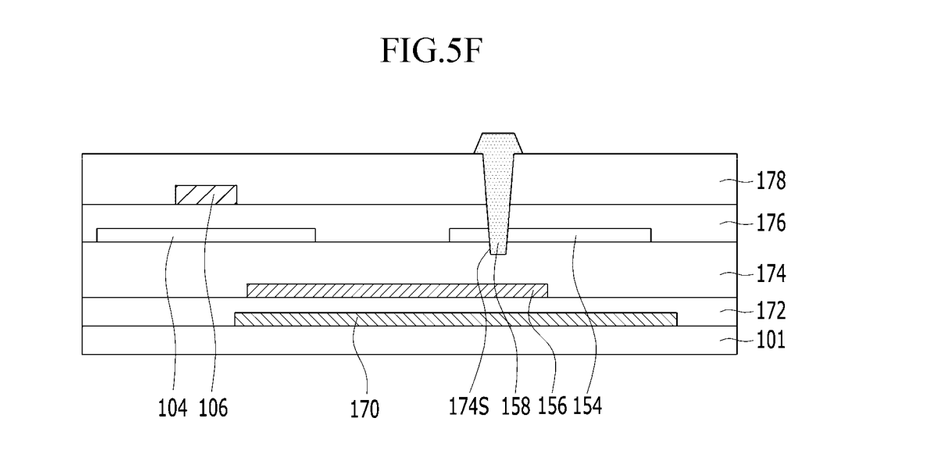
Figure 5G:
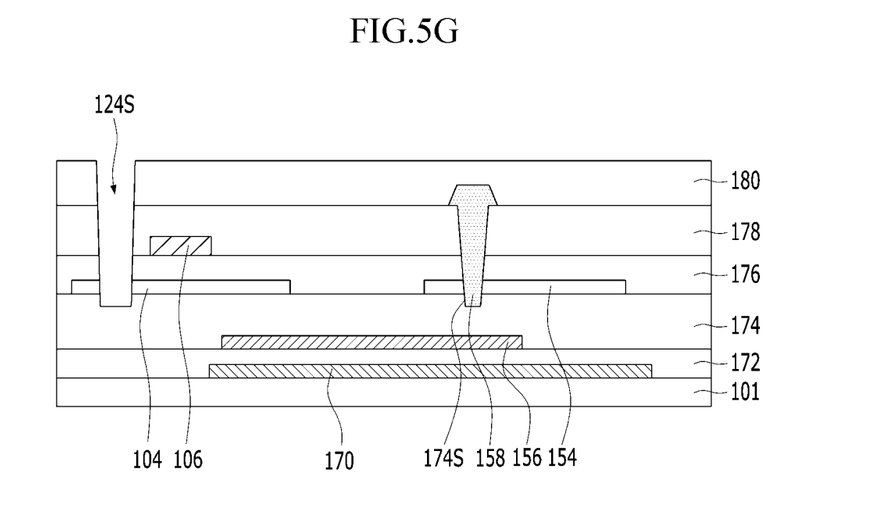
Figure 5H:
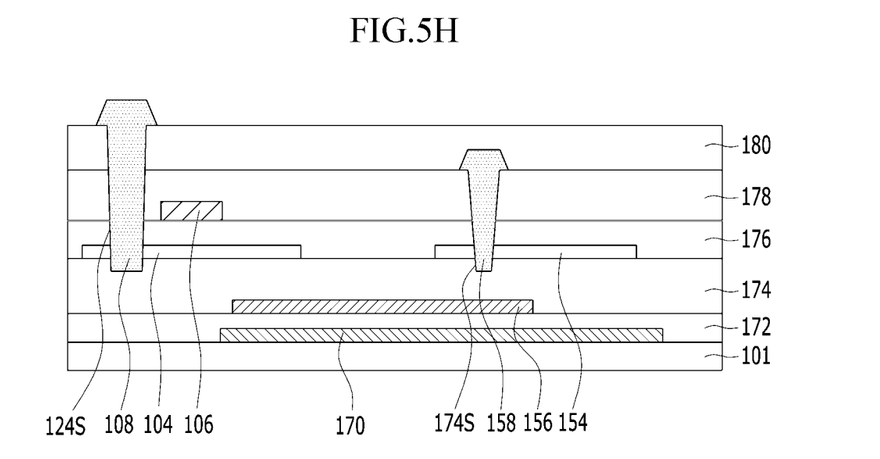
Figure 5I:
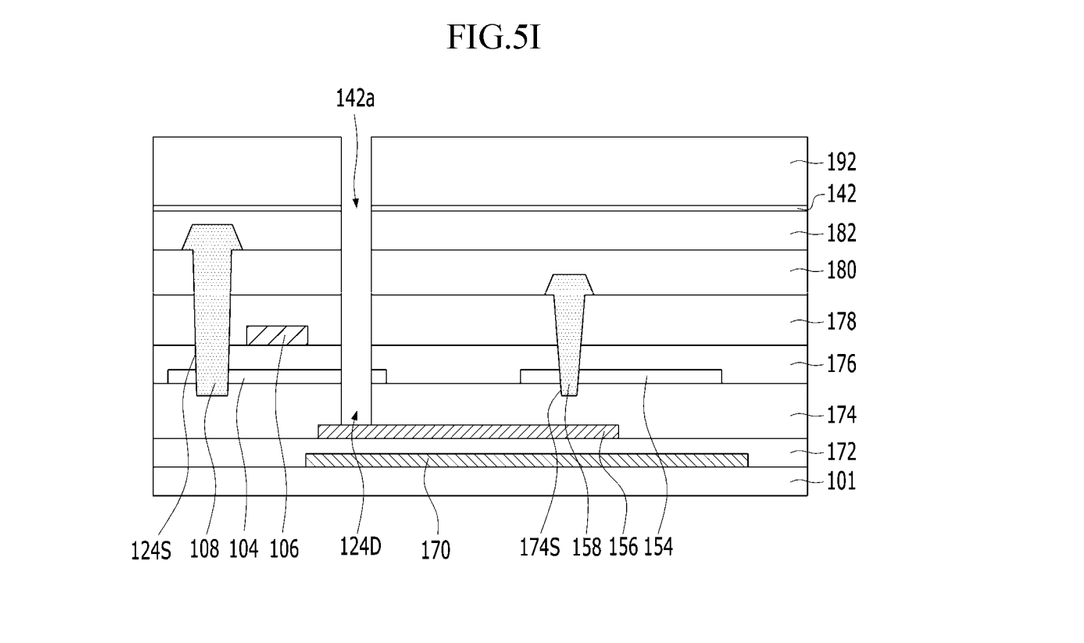
Figure 5J:
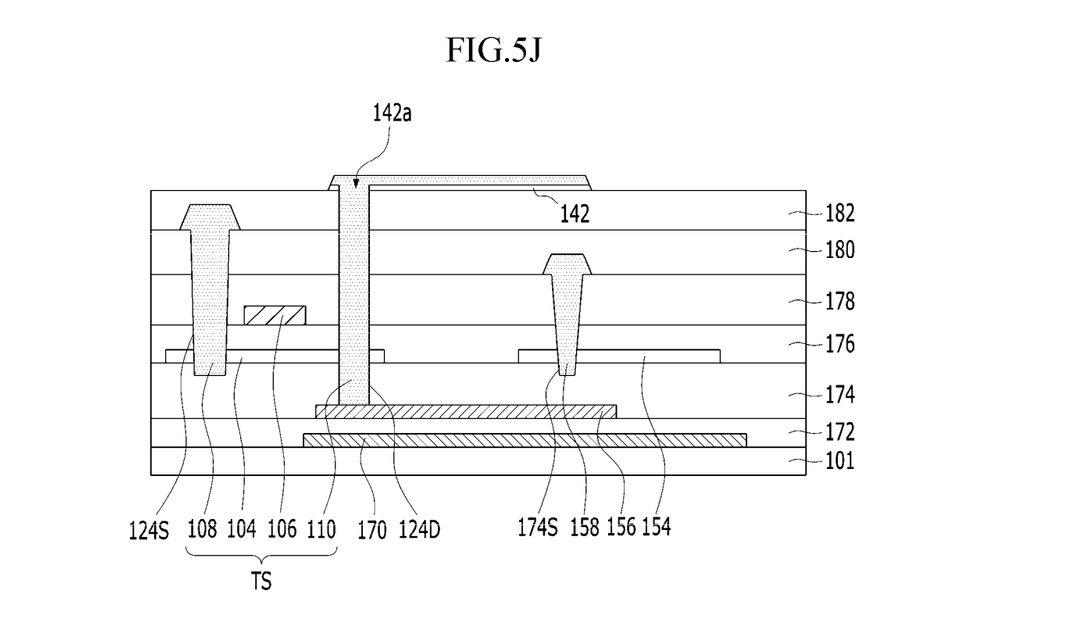
Figure 5K:
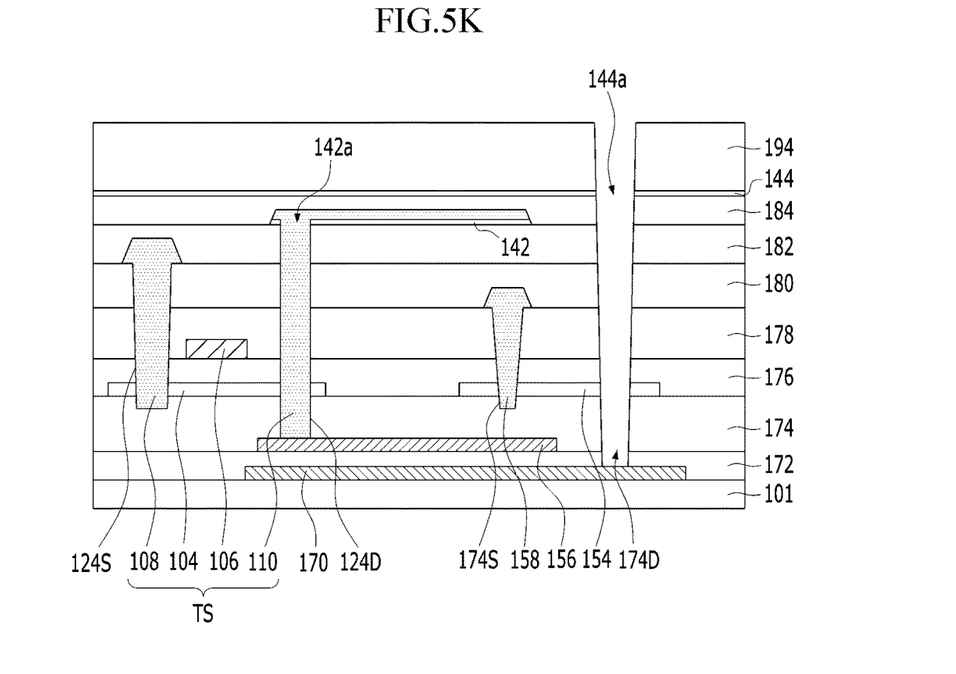
Figure 5L:
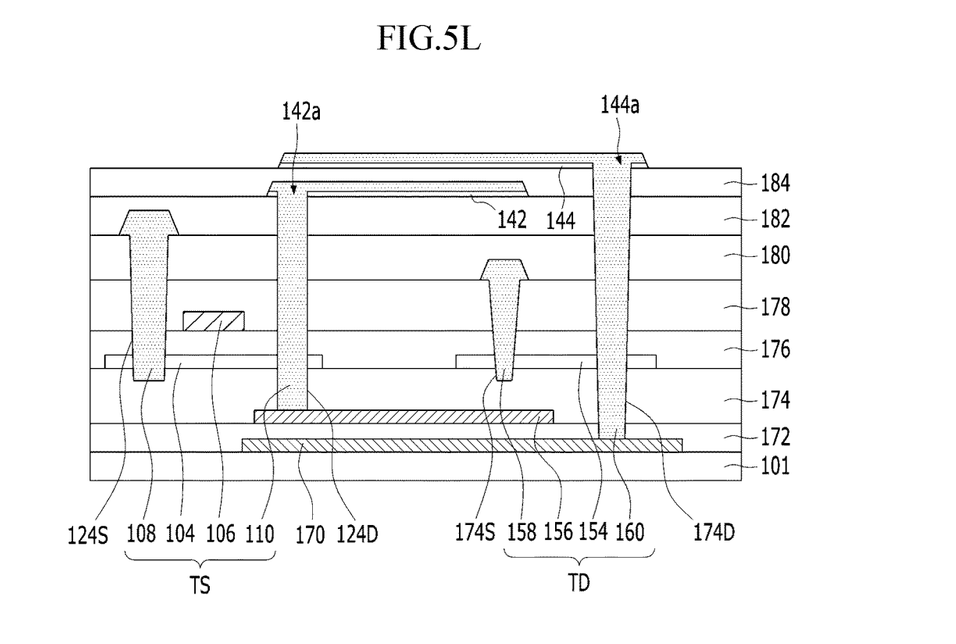
Figure 5M:
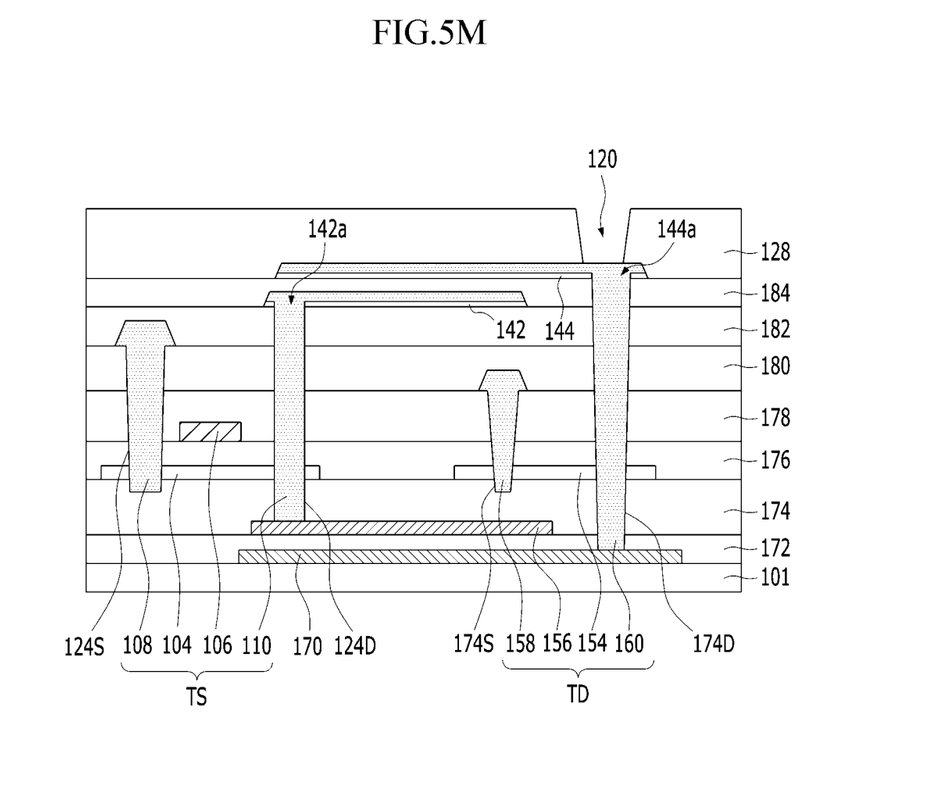
Figure 5N:
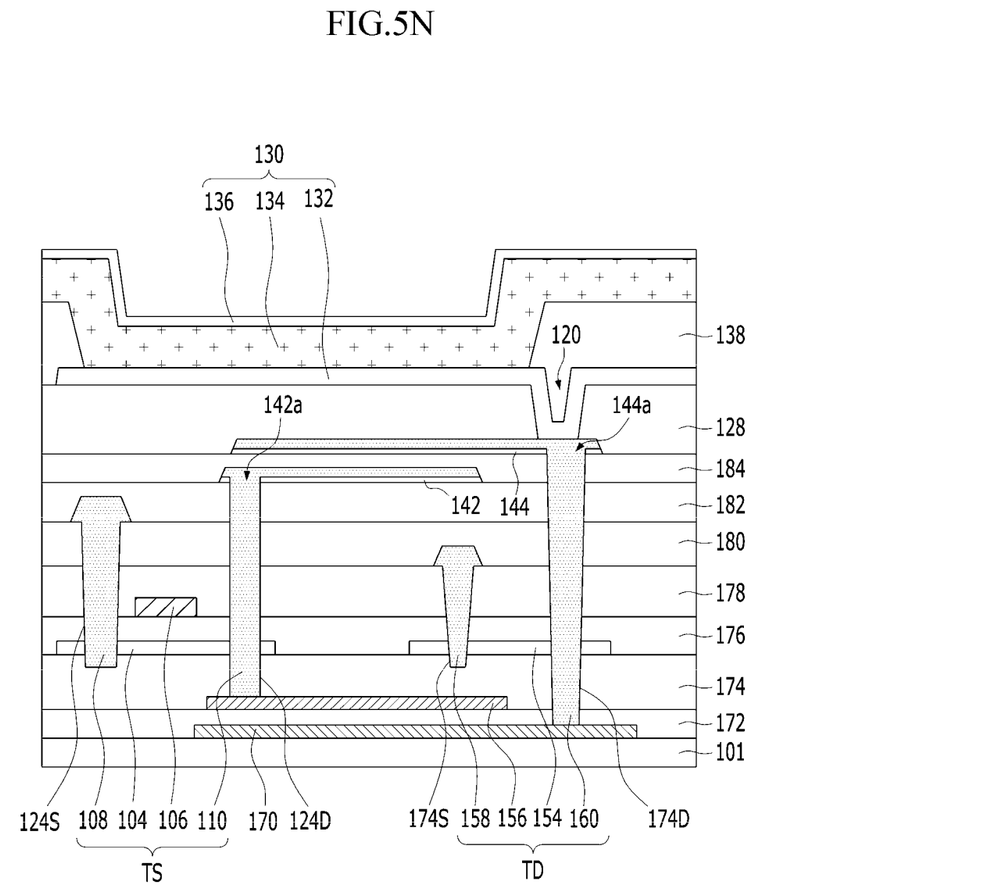

FIGS. 5A to 5N are cross-sectional views illustrating an example method of manufacturing the organic light-emitting display device illustrated in FIG. 2.

With reference to FIG. 5A, the storage electrode 170 is formed on a substrate 101.

Specifically, after a first metal layer is stacked over the entire surface of the substrate 101, which is formed of plastic, glass or a plurality of insulation layers, the first metal layer is patterned through a photolithography process and an etching process, whereby the storage electrode 170 is formed.

With reference to FIG. 5B, the first buffer layer 172 and the second gate electrode 156 are sequentially formed on the substrate 101 on which the storage electrode 170 has been formed.

Specifically, an inorganic insulation material such as, for example, SiOx or SiNx is stacked over the entire surface of the substrate 101 on which the storage electrode 170 has been formed, whereby the first buffer layer 172 is formed. Then, after a second metal layer is deposited over the entire surface of the first buffer layer 172, the second metal layer is patterned through a photolithography process and an etching process, whereby the second gate electrode 156 is formed.

With reference to FIG. 5C, the second buffer layer 174 and the first and second active layers 104 and 154 are sequentially formed on the substrate 101 on which the second gate electrode 156 has been formed.

Specifically, an inorganic insulation material, such as SiOx or SiNx, is stacked over the entire surface of the substrate 101 on which the gate electrode 156 has been formed, whereby the second buffer layer 174 is formed. Then, after a semiconductor layer is deposited over the entire surface of the second buffer layer 174, the semiconductor layer is patterned through a photolithography process and an etching process, whereby the first and second active layers 104 and 154 are formed.

With reference to FIG. 5D, the gate insulation layer 176 and the first gate electrode 106 are sequentially formed on the substrate 101 on which the first and second active layers 104 and 154 have been formed.

Specifically, an inorganic insulation material such as, for example, SiOx or SiNx is stacked over the entire surface of the substrate 101 on which the first and second active layers 104 and 154 have been formed, whereby the gate insulation layer 176 is formed. Then, after a third metal layer is deposited over the entire surface of the gate insulation layer 176, the third metal layer is patterned through a photolithography process and an etching process, whereby the first gate electrode 106 is formed.

With reference to FIG. 5E, the first interlayer insulation layer 178 having the second source contact hole 174S therein is formed on the substrate 101 on which the first gate electrode 106 has been formed.

Specifically, an inorganic insulation material such as, for example, SiOx or SiNx is stacked over the entire surface of the substrate 101 on which the first gate electrode 106 has been formed, whereby the first interlayer insulation layer 178 is formed. Then, a portion of the second buffer layer 174, the second active layer 154, the gate insulation layer 176, and the first interlayer insulation layer 178 are patterned through a photolithography process and an etching process, whereby the second source contact hole 174S is formed. Here, the second source contact hole 174S penetrates a portion of the second buffer layer 174, the second active layer 154, the gate insulation layer 176, and the first interlayer insulation layer 178 to thereby be connected to the exposed side surface of the second active layer 154.

With reference to FIG. 5F, the second source electrode 158 is formed in the substrate 101 on which the second source contact hole 174S has been formed.

Specifically, after a fourth metal layer is deposited over the entire surface of the substrate 101 on which the second source contact hole 174S has been formed, the fourth metal layer is patterned through a photolithography process and an etching process, whereby the second source electrode 158 is formed.

With reference to FIG. 5G, the second interlayer insulation layer 180 having the first source contact hole 124S therein is formed on the substrate 101 on which the second source electrode 158 has been formed.

Specifically, an inorganic insulation material such as, for example, SiOx or SiNx is stacked over the entire surface of the substrate 101 on which the second source electrode 158 has been formed, whereby the second interlayer insulation layer 180 is formed. Then, a portion of the second buffer layer 174, the first active layer 104, the gate insulation layer 176, and the first and second interlayer insulation layers 178 and 180 are patterned through a photolithography process and an etching process, whereby the first source contact hole 124S is formed. Here, the first source contact hole 124S penetrates a portion of the second buffer layer 174, the first active layer 104, the gate insulation layer 176, and the first and second interlayer insulation layers 178 and 180 to thereby be connected to the exposed side surface of the first active layer 104.

With reference to FIG. 5H, the first source electrode 108 is formed on the substrate 101 on which the first source contact hole 124S is formed.

Specifically, after a fifth metal layer is deposited over the entire surface of the substrate 101 on which the first source contact hole 124S has been formed, the fifth metal layer is patterned through a photolithography process and an etching process, whereby the first source electrode 108 is formed.

With reference to FIG. 5I, the first protective layer 182 and the first mask conductive layer 142, which have the first drain contact hole 124D therein, are formed on the substrate 101 on which the first source electrode 108 has been formed.

Specifically, the first protective layer 182 is formed on the substrate 101 on which the first source contact hole 124S has been formed, and a sixth metal layer is formed thereon via, for example, sputtering. The first protective layer 182 is formed of an inorganic insulation material such as, for example, SiOx or SiNx, and the sixth metal layer is formed of at least one of ITO, MoTi, and Al. Subsequently, the photoresist pattern 192 is formed on the sixth metal layer through exposure and developing processes. The sixth metal layer is patterned through a wet or dry etching process using the photoresist pattern 192 as a mask, whereby the first mask conductive layer 142 having the first mask hole 142a is formed. Subsequently, the second buffer layer 174, the first active layer 104, the gate insulation layer 176, the first and second interlayer insulation layers 178 and 180, and the first protective layer 182 are patterned through a dry etching process using, as a mask, the photoresist pattern 192 and the first mask conductive layer 142, whereby the first drain contact hole 124D is formed. Here, the first drain contact hole 124D penetrates the second buffer layer 174, the first active layer 104, the gate insulation layer 176, the first and second interlayer insulation layers 178 and 180, and the first protective layer 182 to thereby be connected to the exposed side surface of the first active layer 104 and the exposed upper surface of the second gate electrode 156. In addition, the first mask conductive layer 142 has the same pattern as the first protective layer 182.

With reference to FIG. 5J, the first drain electrode 110 is formed on the substrate 101 on which the first protective layer 182 and the first mask conductive layer 142, which have the first drain contact hole 124D therein, have been formed.

Specifically, after a seventh metal layer is deposited over the entire surface of the substrate 101 on which the first protective layer 182 and the first mask conductive layer 142, which have the first drain contact hole 124D therein, have been formed, the seventh metal layer is patterned through a photolithography process and an etching process, whereby the first drain electrode 110 is formed. Meanwhile, in order to form the first drain electrode 110, because the first mask conductive layer 142 is etched when the seventh metal layer is etched, the first mask conductive layer 142 that does not overlap the first drain electrode 110 is removed. Thereby, the first mask conductive layer 142 is disposed between the first drain electrode 110 and the upper surface of the first protective layer 182 to overlap the first drain electrode 110.

With reference to FIG. 5K, the second protective layer 184 and the second mask conductive layer 144, which have the second drain contact hole 174D therein, are formed on the substrate 101 on which the first drain electrode 110 has been formed.

Specifically, the second protective layer 184 is formed on the substrate 101 on which the first drain electrode 110 has been formed, and an eighth metal layer is formed thereon via, for example, sputtering. The second protective layer 184 is formed of an inorganic insulation material such as, for example, SiOx or SiNx, and the eighth metal layer is formed of at least one of ITO, MoTi and Al. Subsequently, the photoresist pattern 194 is formed on the eighth metal layer through exposure and developing processes. The eighth metal layer is patterned through a wet or dry etching process using the photoresist pattern 194 as a mask, whereby the second mask conductive layer 144 having the second mask hole 144a is formed. Subsequently, the first buffer layer 172, the second buffer layer 174, the second active layer 154, the gate insulation layer 176, the first and second interlayer insulation layers 178 and 180, the first protective layer 182, and the second protective layer 184 are patterned through a dry etching process using, as a mask, the photoresist pattern 194 and the second mask conductive layer 144, whereby the second drain contact hole 174D is formed. Here, the second drain contact hole 174D penetrates the first buffer layer 172, the second buffer layer 174, the second active layer 154, the gate insulation layer 176, the first and second interlayer insulation layers 178 and 180, the first protective layer 182, the second mask conductive layer 144, and the second protective layer 184 to thereby be connected to the exposed side surface of the second active layer 154 and the exposed upper surface of the storage electrode 170. In addition, the second mask conductive layer 144 has the same pattern as the second protective layer 184.

With reference to FIG. 5L, the second drain electrode 160 is formed on the substrate 101 on which the second protective layer 184 and the second mask conductive layer 144, which have the second drain contact hole 174D therein, have been formed.

Specifically, after a ninth metal layer is deposited over the entire surface of the substrate 101 on which the second protective layer 184 and the second mask conductive layer 144, which have the second drain contact hole 174D therein, have been formed, the ninth metal layer is patterned through a photolithography process and an etching process, whereby the second drain electrode 160 is formed. Meanwhile, in order to form the second drain electrode 160, because the second mask conductive layer 144 is etched when the ninth metal layer is etched, a portion of the second mask conductive layer 144 that does not overlap the second drain electrode 110 is removed. Thereby, the second mask conductive layer 144 is disposed between the second drain electrode 110 and the upper surface of the second protective layer 184 to overlap the second drain electrode 110.

With reference to FIG. 5M, the planarization layer 128 having the pixel contact hole 120 therein is formed on the substrate 101 on which the second drain electrode 160 has been formed.

Specifically, the planarization layer 128 is formed by applying an organic layer over the entire surface of the substrate 101 on which the second drain electrode 160 has been formed. Then, the pixel contact hole 120 is formed to expose the second drain electrode 160 when the organic layer is patterned via a photolithography process.

With reference to FIG. 5N, the anode electrode 132, the bank 138, the light-emitting stack 134, and the cathode electrode 136 are sequentially formed on the substrate 101 on which the planarization layer 128 has been formed.

Specifically, after a tenth metal layer is deposited over the entire surface of the substrate 101 on which the planarization layer 128 has been formed, the tenth metal layer is patterned through a photolithography process, whereby the anode electrode 132 is formed. Then, the bank 134 is formed by applying an organic layer over the entire surface of the substrate 101, on which the anode electrode 132 has been formed, and patterning the organic layer through a photolithography process. Subsequently, the organic light-emitting layer 134 and the cathode electrode 136 are sequentially formed in an active area excluding a pad area through a deposition process using a shadow mask.

Accordingly, the narrow contact holes 124D and 174D may be formed to interconnect an upper conductive layer (e.g., the first drain electrode 110 or the second drain electrode 160) and a lower conductive layer (e.g., the first gate electrode 106 or the storage electrode 170). In particular, in an example embodiment of the present disclosure, even when at least one insulation layer disposed between the upper conductive layer and the lower conductive layer has a thickness of 10,000 Å or more, the narrow contact hole may be formed to have a line width of 2 µm or less by etching the insulation layer using, as a mask, the photoresist pattern and the mask conductive layers 142 and 144. That is, the line width of the contact hole is reduced from the upper conductive layer to the lower conductive layer, and the maximum line width of the contact hole is 2 µm or less, for example, 1.5 µm, and the maximum depth D is 1 µm or more, for example, within a range from 1.2 µm to 1.4 µm. The contact hole may be applied to a high-resolution model, and thus example embodiments of the present disclosure may enable the realization of high resolution. In addition, when at least one insulation layer is etched, the insulation layer may be etched using the mask conductive layers 142 and 144 as a mask even if a photoresist pattern, which is thinner than the related art, is damaged, and therefore the contact holes 124D and 174D may be stably formed.

Meanwhile, although the pixel drive circuit has been described in example embodiments of the present disclosure as including the switching and driving thin-film transistors and one storage capacitor by way of example, the structure of the pixel drive circuit is given as an example, and is not limiting. For example, the pixel drive circuit may further include a sensing transistor. Here, the sensing transistor senses the threshold voltage of the driving thin-film transistor TD, and the data voltage is compensated in proportion to the sensed threshold voltage.

As is apparent from the above description, according to example embodiments of the present disclosure, even when at least one insulation layer disposed between an upper layer and a lower layer has a thickness of 10,000 Å, a narrow contact hole having a width of 2 µm or less may be formed by etching the insulation layer using a photoresist pattern and a mask conductive layer. In addition, even if the photoresist pattern, which has a smaller thickness compared to the related art, is damaged when the insulation layer is etched, the insulation layer may be etched using the mask conductive layer as a mask, which ensures the stabilized formation of the contact hole.

It will be apparent to those skilled in the art that various modifications and variations can be made in the display device substrate, an organic light-emitting display device including the same, and a method of manufacturing the same of the present disclosure without departing from the spirit or scope of the disclosure. Thus, it is intended that the present disclosure cover the modifications and variations of this disclosure provided they come within the scope of the appended claims and their equivalents.

What is claimed is:

1. An organic light-emitting display device, comprising:
a substrate;
a switching thin-film transistor on the substrate;
a driving thin-film transistor connected to the switching thin-film transistor; and
a light-emitting element connected to the driving thin-film transistor,
wherein the switching thin-film transistor and the driving thin-film transistor together include:
a lower conductive layer on the substrate;

an insulation layer having therein a contact hole configured to expose the lower conductive layer;

an upper conductive layer connected to the lower conductive layer through the contact hole; and a mask conductive layer between an upper surface of the insulation layer and the upper conductive layer to overlap the upper conductive layer.

2. The device according to claim 1, wherein the upper conductive layer is a drain electrode of the switching thin-film transistor, and wherein the lower conductive layer is a gate electrode of the driving thin-film transistor.

3. The device according to claim 2, further comprising a storage capacitor connected to each of the switching thin-film transistor and the driving thin-film transistor, wherein the upper conductive layer is a drain electrode of the driving thin-film transistor, and wherein the lower conductive layer is a storage electrode of the storage capacitor.

4. The device according to claim 1, wherein the contact hole has a line width of 2 µm or less.

5. The device according to claim 1, wherein the insulation layer is of an inorganic insulation material, and wherein the mask conductive layer is a single-layer structure or a multilayered structure of least one of ITO, MoTi, and Al.

6. The device according to claim 1, wherein the mask conductive layer has a mask hole configured to overlap the contact hole.

7. A display device substrate, comprising:

a base substrate;

a lower conductive layer on the base substrate;

an insulation layer having therein a contact hole configured to expose the lower conductive layer;

an upper conductive layer connected to the lower conductive layer through the contact hole; and a mask conductive layer between an upper surface of the insulation layer and the upper conductive layer to overlap the upper conductive layer.

8. The display device substrate according to claim 7, wherein the insulation layer is of an inorganic insulation material, and wherein the mask conductive layer is a single-layer structure or a multilayered structure of at least one of ITO, MoTi, and Al.

9. The display device substrate according to claim 7, wherein the mask conductive layer has a mask hole configured to overlap the contact hole.

10. A method of manufacturing a display device substrate, comprising:

forming a lower conductive layer on a base substrate;

forming an insulation layer, having therein a contact hole configured to expose the lower conductive layer, and a mask conductive layer; and forming an upper conductive layer connected to the lower conductive layer through the contact hole, wherein the mask conductive layer is disposed between an upper surface of the insulation layer and the upper conductive layer to overlap the upper conductive layer.

11. The method according to claim 10, wherein the forming the insulation layer and the mask conductive layer includes:

sequentially stacking the insulation layer and the mask conductive layer to cover the lower conductive layer;

wet-etching the mask conductive layer; and dry-etching the insulation layer, wherein the forming the upper conductive layer includes removing the mask conductive layer that does not overlap the upper conductive layer.

12. The method according to claim 10, wherein the insulation layer is formed of an inorganic insulation material, and wherein the mask conductive layer is formed as a single-layer structure or a multilayered structure using at least one of ITO, MoTi, and Al.

* * * * *